United States Patent
Murakami

(10) Patent No.: US 6,553,546 B1
(45) Date of Patent: Apr. 22, 2003

(54) FAILURE ANALYZING APPARATUS AND FAILURE ANALYZING METHOD FOR SEMICONDUCTOR INTEGRATED CIRCUIT

(75) Inventor: Tamie Murakami, Oita (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 101 days.

(21) Appl. No.: 09/708,487

(22) Filed: Nov. 9, 2000

(30) Foreign Application Priority Data

Nov. 10, 1999 (JP) .......................... 11-320007
Jun. 1, 2000 (JP) ........................ 2000-164692

(51) Int. Cl.[7] ............................................. G06F 17/50
(52) U.S. Cl. .......................... 716/4; 359/382; 250/307
(58) Field of Search .................. 716/1–21; 714/737, 714/738, 727, 724, 218, 720, 46, 718; 250/307, 492.2; 359/382; 324/158.1, 765; 702/15; 382/280

(56) References Cited

U.S. PATENT DOCUMENTS 5,561,293 A * 10/1996 Peng et al. ................. 250/307
5,663,967 A * 9/1997 Lindberg et al. ............ 714/737
5,764,409 A * 6/1998 Colvin ........................ 359/382

FOREIGN PATENT DOCUMENTS

JP           10-4128           1/1998

* cited by examiner

Primary Examiner—Vuthe Siek
Assistant Examiner—Helen Rossoshek
(74) Attorney, Agent, or Firm—Finnegan, Henderson, Farabow, Garrett & Dunner, L.L.P.

(57) ABSTRACT

To specify a failure location in a semiconductor integrated circuit chip in operation, an emission image of a good semiconductor integrated circuit chip and an emission image of a target semiconductor integrated circuit chip to be subjected to failure analysis are detected and compared with each other to analyze a failure. As a test pattern generated by a function tester is supplied to good and defective semiconductor integrated circuit chips, hot electrons are emitted from where the operational semiconductor integrated circuit chip fails and are detected as an emission image by an emission analyzer. Then, an image processing unit performs image processing to subtract an emission image corresponding to the defective semiconductor integrated circuit chip from an emission image corresponding to a good semiconductor integrated circuit chip to extract the emission image of the failure location, which is displayed on a monitor.

18 Claims, 8 Drawing Sheets

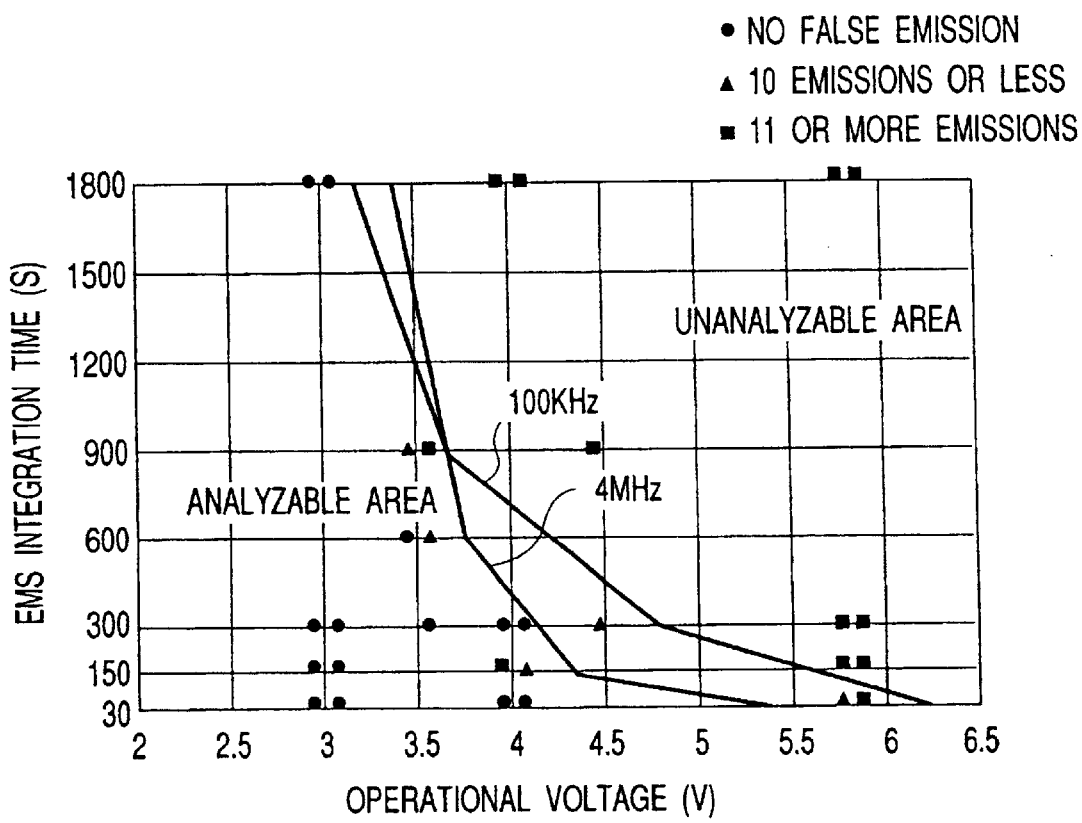
FIG. 4
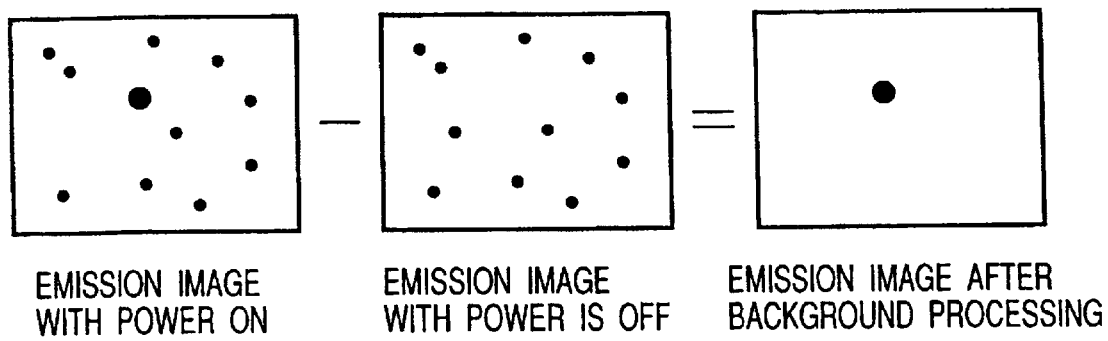
FIG. 5A — EMISSION IMAGE WITH POWER ON
FIG. 5B — EMISSION IMAGE WITH POWER IS OFF
FIG. 5C — EMISSION IMAGE AFTER BACKGROUND PROCESSING

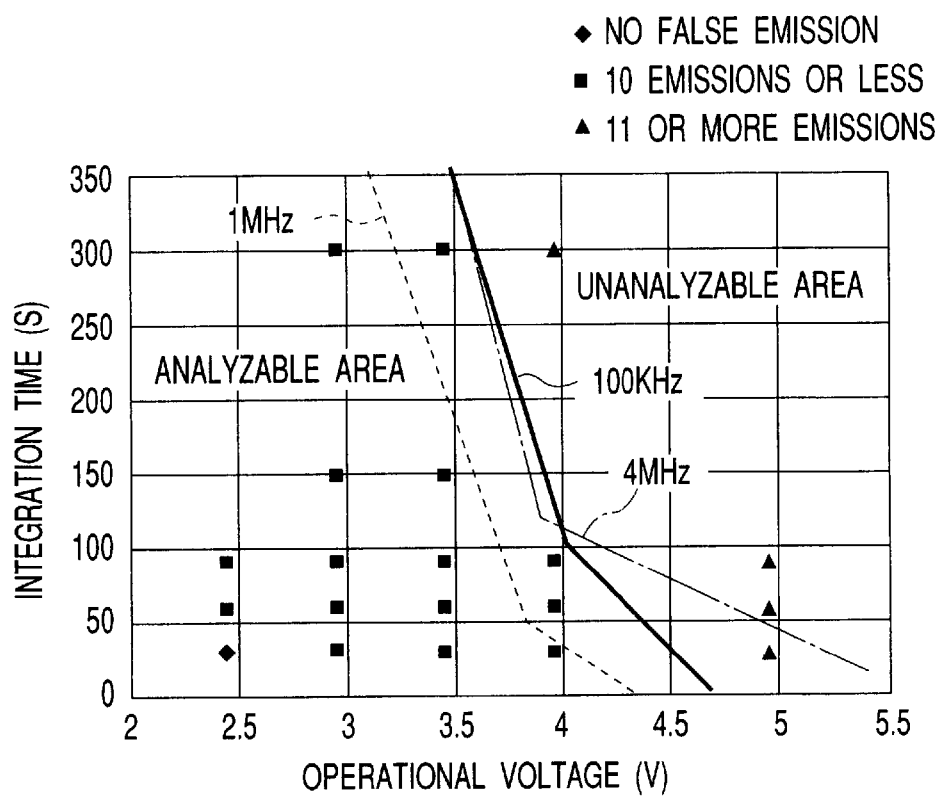
FIG. 11
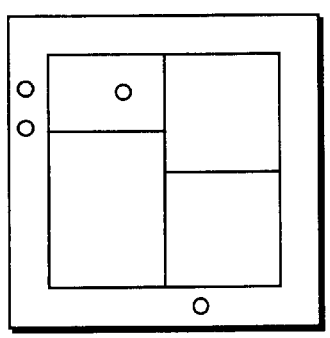 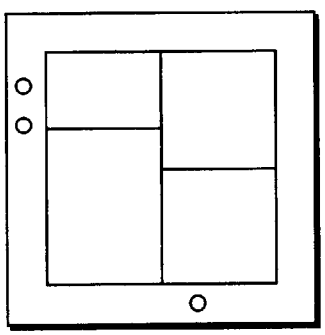 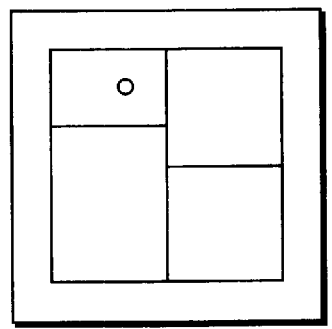
FIG. 12A     FIG. 12B     FIG. 12C

FAILURE ANALYZING APPARATUS AND FAILURE ANALYZING METHOD FOR SEMICONDUCTOR INTEGRATED CIRCUIT

CROSS-REFERENCE TO RELATED APPLICATIONS

This application is based upon and claims the benefit of priority from the prior Japanese Patent Applications No. 11-320007, filed Nov. 10, 1999; and No. 2000-164692, filed Jun. 1, 2000, the entire contents of which are incorporated herein by reference.

BACKGROUND OF THE INVENTION

The present invention relates to a failure analyzing apparatus and a failure analyzing method for a semiconductor integrated circuit, which specify or localize the location of a failure (hereinafter referred to as "failure location") by using an emission image formed by hot electrons that are emitted from the surface of a semiconductor integrated circuit chip.

Due to the recent ever-improving scale and integration density of very large scale semiconductor integrated circuits (VLSIs), it has become significantly important to develop the technique of specifying failure locations and shorten the analyzing time.

The typical analysis on the function failure of a VLSI is a failure location specifying scheme which uses a simulator and electron beam (EB) tester.

This conventional scheme using a simulator and EB tester establishes a link to a CAD (Computer Aided Design) unit, generates a failure dictionary and narrows down probe points based on the results of the actual simulation analysis and failure simulation results, and then performs failure analysis by actually using a simulator and EB tester. The conventional scheme therefore requires a significant amount of pre-analysis processing, which is likely to increase the time needed to specify a failure location.

There is a standby EMS (Emission Micro Scope) scheme which holds a device, such as a semiconductor integrated circuit chip, in a standby state or a stable operational state, integrates hot electrons that are generated from a failure location to acquire an emission image, and specifies the failure location based on the emission image.

This scheme cannot however accomplish EMS analysis on dynamic type products which are not easily held at a stable operational state and analog-mixed products that have a circuit in which a through current always flows.

In short, the conventional failure analyzing apparatus and method that use a simulator and EB tester undesirably requires a long time for specifying a failure location. Further, the conventional failure analyzing apparatus and method that employ the standby EMS scheme cannot perform failure analysis on dynamic type products and analog-mixed products.

BRIEF SUMMARY OF THE INVENTION

Accordingly, it is an object of the present invention to provide a failure analyzing apparatus and failure analyzing method for a semiconductor integrated circuit, which can shorten the time needed to specify a failure location and can perform failure analysis on dynamic type products and analog-mixed products.

It is another object of this invention to provide a failure analyzing apparatus for a semiconductor integrated circuit which can specify a real failure location.

To achieve the above objects, according to one aspect of this invention, there is provided a failure analyzing apparatus for a semiconductor integrated circuit, which comprises a test signal generating section for generating test signals for operating a semiconductor integrated circuit chip; an emission image detecting section for detecting an emission image formed by hot electrons emitted from a good semiconductor integrated circuit chip and an emission image formed by hot electrons emitted from a target semiconductor integrated circuit chip to be subjected to failure analysis, both chips being operable upon reception of the test signal; and an image processing section, connected to the emission image detecting section, for specifying a failure location in the target semiconductor integrated circuit chip based on both emission images detected by the emission image detecting section.

According to another aspect of this invention, there is provided a failure analyzing method for a semiconductor integrated circuit, which comprises the steps of operating a good semiconductor integrated circuit chip and a target semiconductor integrated circuit chip to be subjected to failure analysis by supplying test signals to the good semiconductor integrated circuit chip and the target semiconductor integrated circuit chip from a testing device; detecting an emission image formed by hot electrons emitted from the good semiconductor integrated circuit chip and an emission image formed by hot electrons emitted from the target semiconductor integrated circuit chip by using an emission analyzer; and specifying a failure location in the target semiconductor integrated circuit chip by performing image processing on both emission images detected.

According to a further aspect of this invention, there is provided a failure analyzing apparatus for a semiconductor integrated circuit, which comprises a function tester for generating test signals and supplying the test signals to a semiconductor integrated circuit chip to execute a function test thereof; an emission analyzer for detecting an emission image formed by hot electrons emitted from the semiconductor integrated circuit chip when the function test is performed by the function tester; an image processing device, connected to the emission analyzer, for specifying a failure location in a target semiconductor integrated circuit chip to be subjected to failure analysis, based on an emission image of a good semiconductor integrated circuit chip detected by the emission analyzer and an emission image of the target semiconductor integrated circuit chip; and a display device, connected to the image processing device, for displaying the failure location specified by the image processing device.

According to a still further aspect of this invention, there is provided a failure analyzing apparatus for a semiconductor integrated circuit, which comprises a function tester for generating supply voltages and test signals and supplying the supply voltages and the test signals to a semiconductor integrated circuit chip to execute a function test thereof; an emission analyzer for detecting an emission image by integrating hot electrons emitted from the semiconductor integrated circuit chip when the function test is performed by the function tester, an integration time for the hot electrons being variable; an image processing device, connected to the emission analyzer, for specifying a failure location in a target semiconductor integrated circuit chip to be subjected to failure analysis, based on an emission image of a good semiconductor integrated circuit chip detected by the emission analyzer and an emission image of the target semiconductor integrated circuit chip; a display device, connected to the image processing device, for displaying the failure location specified by the image processing device; and a condition providing device for altering an operational condition by variously changing at least a value of the supply voltages generated by the function tester and/or the integration time for hot electrons in the emission analyzer, causing the function tester to operate the target semiconductor integrated circuit chip in each alteration to check a number of occurrences of false emission caused by emission images detected by the emission analyzer, and acquiring that operational condition under which the number of occurrences of false emission becomes equal to or smaller than a predetermined value, whereby an operation of the function tester and/or an operation of the emission analyzer is controlled based on the operational condition acquired by the condition providing device.

According to a yet still further aspect of this invention, there is provided a failure analyzing apparatus for a semiconductor integrated circuit, which comprises a function tester for generating supply voltages and test signals and supplying the supply voltages and the test signals to a semiconductor integrated circuit chip to execute a function test thereof; an emission analyzer for detecting an emission image by integrating hot electrons emitted from the semiconductor integrated circuit chip when the function test is performed by the function tester, an integration time for the hot electrons being variable; an image processing device, connected to the emission analyzer, for specifying a failure location in a target semiconductor integrated circuit chip to be subjected to failure analysis, based on an emission image of a good semiconductor integrated circuit chip detected by the emission analyzer and an emission image of the target semiconductor integrated circuit chip, and outputting coordinate data of the failure location; a display device, connected to the image processing device, for displaying the failure location specified by the image processing device; a condition providing device for altering an operational condition by variously changing at least a value of the supply voltage generated by the function tester and/or the integration time for hot electrons in the emission analyzer, causing the function tester to operate the target semiconductor integrated circuit chip in each alteration to check a number of occurrences of false emission caused by emission images detected by the emission analyzer, and acquiring that operational condition under which the number of occurrences of false emission becomes equal to or smaller than a predetermined value, whereby an operation of the function tester and/or an operation of the emission analyzer is controlled based on the operational condition acquired by the condition providing device; a navigation device, connected to the image processing device, for storing net data and coordinate data of the target semiconductor integrated circuit chip and generating node data and coordinate data which are associated with a node of a preceding circuit of a node corresponding to the coordinate data output from the image processing device; a potential measuring device, connected to the navigation device, for measuring a potential of a surface of the semiconductor integrated circuit at a position corresponding to the coordinate data generated by the navigation device; a potential comparing device, connected to the potential measuring device and the navigation device, for storing expected value data of potentials at all nodes of the target semiconductor integrated circuit chip and comparing the potential measured by the potential measuring device with an expected value of a node corresponding to the node data provided by the navigation device; and a coordinate data outputting device, connected to the potential comparing device, for outputting coordinate data of the node corresponding to the node data provided by the navigation device to the display device as coordinate data corresponding to a failure location in the target semiconductor integrated circuit chip when the potential measured by the potential measuring device does not match with the expected value of the node corresponding to the node data provided by the navigation device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a characteristic diagram showing the number of occurrences of false emission with respect to various supply voltages, frequencies and integration times;

FIGS. 5A to 5C are diagrams showing background processing by a failure analyzing method using the conventional standby EMS scheme;

FIG. 11 is a diagram showing examination results given on Table 1 plotted as characteristic curves;

FIGS. 12A through 12C are diagrams showing one example of an emission image obtained by an emission analyzer in the failure analyzing apparatus shown in FIG. 7 and an emission image after being subjected to image processing in an image processing unit.

DETAILED DESCRIPTION OF THE INVENTION

Before going into the description of preferred embodiments of this invention, the principle of a failure analyzing apparatus and a failure analyzing method for a semiconductor integrated circuit according to this invention will be discussed.

To specify a failure location by performing failure analysis, this invention employs an IDDA (Activate Vdd Supply Current)-EMS (Emission Micro Scope) scheme using a function tester and an emission analyzer. The IDDA-EMS scheme continuously operates a target semiconductor integrated circuit (IC) chip to be subjected to failure analysis by supplying test patterns of a defective category to the target semiconductor IC chip from a function tester, when the result of a test conducted by the function tester is NG (unsatisfactory function test), and acquires an emission image, formed by the hot electrons that are emitted from the chip at that time, by EMS analysis.

Figure 1:
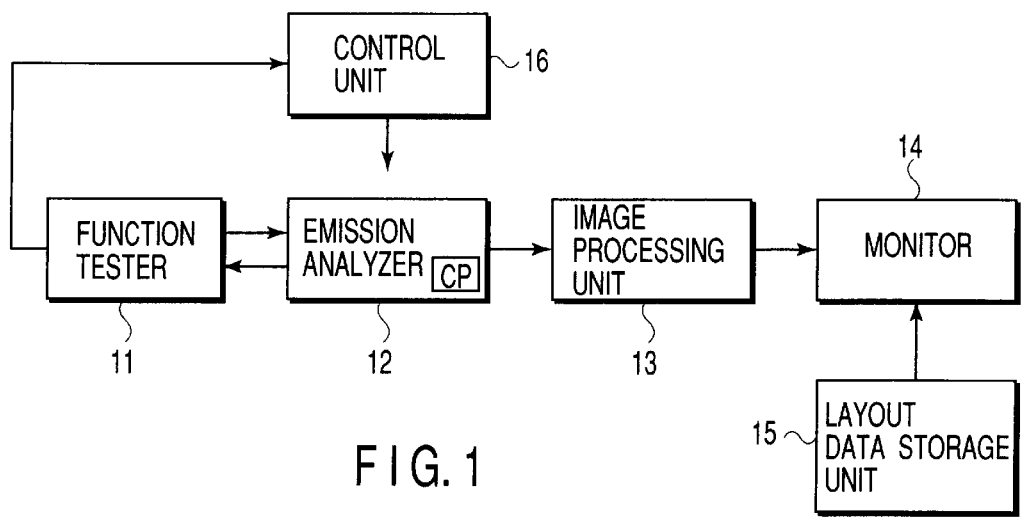
FIG. 1 is a block diagram illustrating the structure of a failure analyzing apparatus according to a first embodiment of this invention.

FIG. 1 is a block diagram illustrating the structure of a failure analyzing apparatus according to a first embodiment of this invention which uses this principle. A function tester (test signal generating section) 11 generates supply voltages and predetermined test signals. The supply voltages and test signals are supplied to a good or defective semiconductor IC chip CP placed in an emission analyzer 12. When supplied with the supply voltages and test signals, the semiconductor IC chip CP operates based on the test signals. As the semiconductor IC chip CP operates, hot electrons are emitted from a failure location in the chip CP. The emission that is made by the hot electrons emitted from the semiconductor IC chip CP is detected as an emission image and analyzed by the emission analyzer 12. The emission image analyzed by the emission analyzer 12 is input to an image processing unit 13.

The image processing unit 13 performs predetermined image processing to specify a failure location in the semiconductor IC chip CP and outputs image data for displaying a predetermined mark, such as a circle, at a position corresponding to the failure location. The image data output from the image processing unit 13 is input to a monitor 14.

Layout data of the target semiconductor IC chip CP is stored as image data in a layout data storage unit 15. The image data stored in this unit 15 is sent to the monitor 14. Therefore, the monitor 14 displays the image of the layout data of the target semiconductor IC chip with a predetermined mark, such as a circle, put on the position that corresponds to the failure location.

A control unit 16 has a CPU, a memory circuit and a data recording/reproducing device which drives a data storage medium (e.g., a floppy disk) where a program and data are recorded. The control unit 16 controls the operations of the function tester 11, emission analyzer 12, image processing unit 13, monitor 14 and layout data storage unit 15 based on a control program stored in the memory circuit. When the function tester 11 supplies the supply voltages and test signals to a semiconductor IC chip and this semiconductor IC chip has an IDD standby failure (initial failure) or a function failure, the control unit 16 is informed of such a failure together with the state of the failure (e.g., data of the size of the leak current if it is flowing between power supplies).

As the emission image that is formed by the hot electrons emitted from a semiconductor IC chip in a single operation demonstrates a small amount of emission, the semiconductor IC chip is repeatedly operated until the emission analyzer 12 acquires an emission image which has a sufficient amount of emission to ensure analysis in the image processing unit 13 and the amount of emission is integrated by the emission analyzer 12.

Available schemes for the integration of the amount of emission include a scheme which repeatedly operates a semiconductor IC chip using the test signals indicating only a failure (NG) of a semiconductor IC chip and integrates the amount of emission, or a scheme which repeatedly operates a semiconductor IC chip using such test signals as to increase the activation ratio of a semiconductor IC chip and integrates the amount of emission. A failure location can efficiently be specified by those methods.

When a function failure occurs, the image processing unit 13 performs various kinds of image processing on an emission image which is obtained by the emission analyzer 12 at the time a semiconductor IC chip previously determined as passed or good operates and an emission image which is obtained by the emission analyzer 12 at the time a defective semiconductor IC chip operates, e.g., a process of acquiring a difference between both emission images, and specifies a failure location in the defective semiconductor IC chip based on the result of this difference acquiring process.

Figure 2:
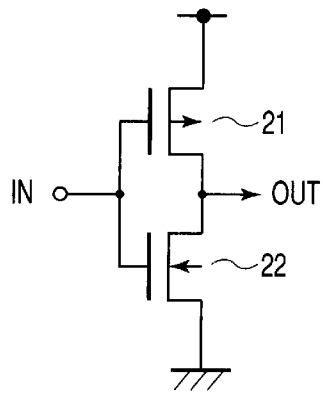
FIG. 2 is a circuit diagram exemplifying a semiconductor integrated circuit which is to be analyzed by the failure analyzing apparatus in FIG. 1.

A description will now be given of a failure analyzing method for a semiconductor integrated circuit using the failure analyzing apparatus with the above-described structure. Let us suppose that, as shown in, for example, FIG. 2, a sample to be subjected to failure analysis (a semiconductor IC chip or a wafer on which multiple chips are integrated) includes a CMOS inverter circuit, which comprises a P channel MOS transistor 21 and an N channel MOS transistor 22, and that the source and drain of the P channel MOS transistor 21 in a target defective sample to be subjected to failure analysis are short-circuited.

The function tester 11 supplies test signals to good and defective samples which have the above circuit structure to operate the samples and the emission analyzer 12 detects and analyzes emission images of both samples. Because the amount of emission of the emission image that is formed by the hot electrons emitted in a single operation of a semiconductor IC chip is not much as mentioned above, the good and defective samples are repeatedly operated until the emission analyzer 12 acquires emission images which have a sufficient amount of emission to ensure analysis and the obtained emission images are integrated.

Figure 3:
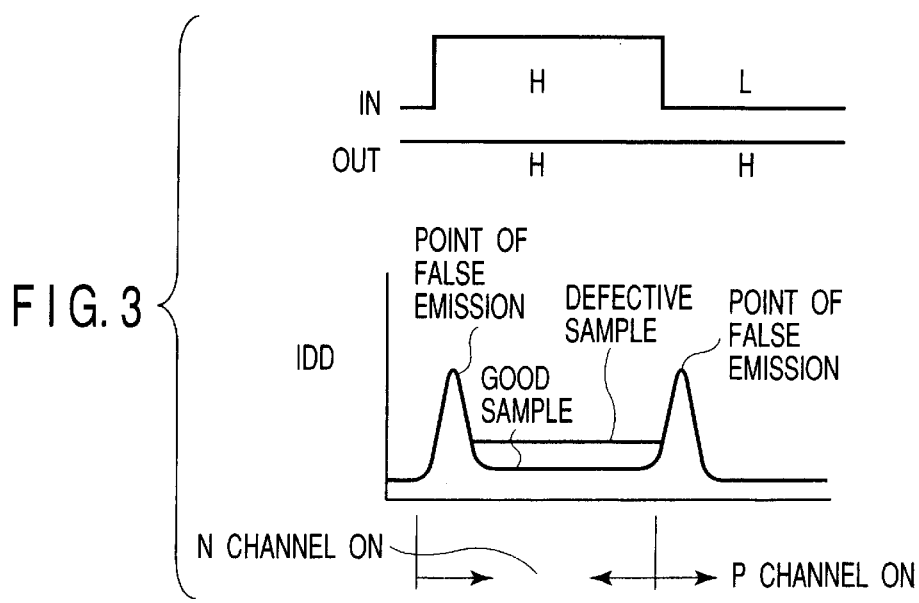
FIG. 3 is a diagram showing input and output signals in the circuit in FIG. 2 and the waveform of the current that flows in the circuit.

FIG. 3 shows an input signal IN to be input to a common gate node of both transistors 21 and 22 and an output signal OUT which is output from a common drain node of the transistors 21 and 22, together with a current IDD which flows in this CMOS inverter circuit.

When the input signal IN has an H level, the P channel MOS transistor 21 is turned off and the N channel MOS transistor 22 is turned on so that the output signal OUT should have an L level. As the source and drain of the P channel MOS transistor 21 in the defective sample are short-circuited, however, the output signal OUT goes to an H level.

When the input signal IN has an L level, on the other hand, the P channel MOS transistor 21 is turned on and the N channel MOS transistor 22 is turned off so that the output signal OUT goes to an H level.

Therefore, the current IDD that flows while the N channel MOS transistor 22 is on becomes greater in the defective sample than in the good sample, and the current difference appears as a difference in the amount of emission.

But, a large direct current flows when the P channel MOS transistor 21 and the N channel MOS transistor 22 are switched on from the off state or switched off from the on state. Therefore, the value of the current IDD becomes larger in both the good and defective samples at the time of the switching. The direct current that temporarily flows in accordance with the switching of the transistors causes false emission whose amount becomes nearly the same in both the good and defective samples as shown in FIG. 3 because the value of the direct current is the same. The false emission occurs at a portion where the current always flows via a load element in addition to a portion where the direct current flows in accordance with the switching of the transistors.

It is necessary to suppress such false emission. False emission is suppressed by the following two methods: one is to optimize the supply voltage, the operational frequency and the integration time of emission and the other is background processing.

To consider the optimization the supply voltage and the operational frequency of a chip for false emission, the number of occurrences of false emission with respect to various supply voltages, frequencies and integration times were examined. The results are illustrated in the characteristic diagram of FIG. 4, which shows the EMS integration time (s) on the vertical scale and the operational voltage (V) on the horizontal scale with two operational frequencies of 100 KHz and 4 MHz.

Under the condition that analysis is possible when the number of false emissions is equal to or less than ten in the entire sample, for example, the left-hand side to each characteristic curve including points on the curve is an analyzable area and the right-hand side becomes an unanalyzable area. Analysis can therefore be carried out efficiently by properly using this condition in accordance with a sample to be analyzed.

Background processing will now be discussed.

According to the analyzing method using the conventional standby EMS scheme, background processing is performed as image processing to subtract minute light which leaks in an EMS analyzer or heat generated in a semiconductor IC chip to be analyzed, as background, from an emission image. The "background" in this case is to acquire an emission image in a power ON state as shown in FIG. 5A and an emission image in a power OFF state as shown in FIG. 5B first and then subtract the latter emission image from the former emission image, thereby yielding an emission image which shows emission only at a failure location as shown in FIG. 5C.

In this embodiment, the image processing unit 13 carries out this background processing which subtracts emission originated from the heat generated in a sample in operation as background. Specifically, as mentioned earlier, the background processing is executed by acquiring the difference between the emission image that is detected when a good sample operates and the emission image that is detected when a defective sample operates.

Figure 6A:
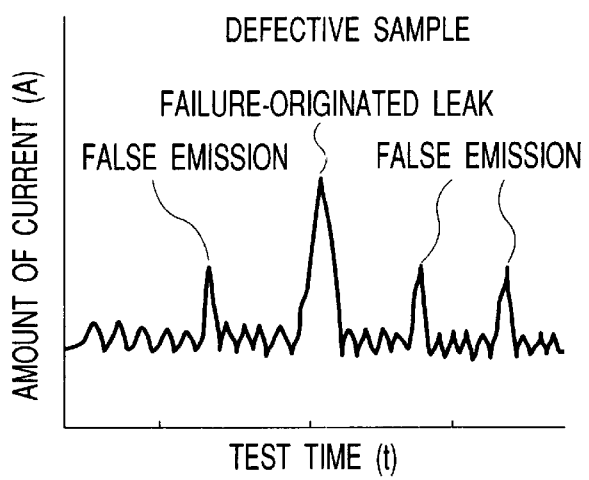
FIGS. 6A to 6C are diagrams illustrating background processing according to the first embodiment.
Figure 6B:
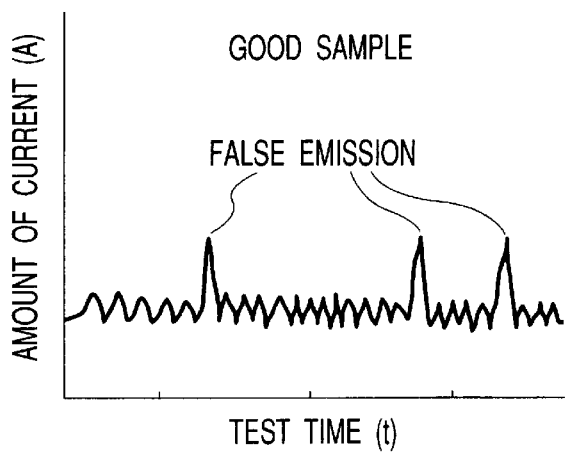
Figure 6C:
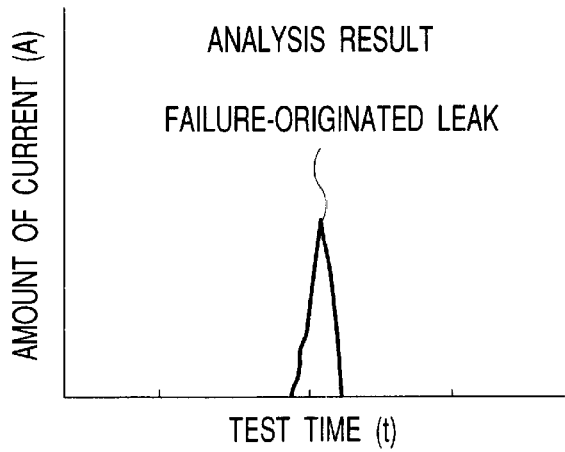

FIG. 6A shows the relationship that a test time (t) and the amount of current (A) have when the amount of emission representing an emission image acquired by a defective sample operates is converted to the amount of current. In this diagram, a point where a large peak current is seen indicates failure-originated leak and some points where peak currents smaller than the largest one are seen are originated from the aforementioned through current. By contrast, FIG. 6B shows the relationship that the test time (t) and the amount of current (A) have when the amount of emission representing an emission image acquired by a good sample operates is converted to the amount of current, and shows only several smaller peak current portions, not a point equivalent to the large peak current in FIG. 6A. Subtracting the amount of the current shown in FIG. 6B from the amount of the current shown in FIG. 6A extracts only the failure-originated leak current as shown in FIG. 6C.

That is, background processing in this embodiment is to acquire the difference between the emission image of a defective sample and the emission image of a good sample or subtract the emission image of a good sample from the emission image of a defective sample to eliminate false emission which is generated at the time of switching or false emission in an analog circuit and to extract an emission image originated from the leak current generated from a failure location alone. Based on the emission image acquired this way, the image processing unit 13 specifies a failure location and the monitor 14 then displays an image which specifies a failure location by showing the layout data of the sample with a predetermined mark, such as a circle, put on the position that corresponds to the failure location.

According to the above-described failure analyzing apparatus and method, the supply voltages and test signals are supplied to a defective sample from the function tester 11, the chip is set in an operational state to recreate a failure, and emission images of both good and defective samples are acquired and compared with each other. The failure analyzing apparatus and method therefore eliminate the need for a vast amount of pre-analysis processing which is required by the conventional method that uses a simulator and EB tester and can specify a failure location in a short period of time.

Because emission images of both good and defective samples are acquired and compared with each other and it is unnecessary to hold a sample in a stable operational state as needed in the prior art, the failure analyzing apparatus and method of this embodiment can also perform failure analysis on dynamic type products and analog-mixed products or the like, which has not been possible by the EMS scheme.

Failure analysis was performed on the short-circuiting between interconnecting lines formed of polysilicon by using the conventional standby EMS scheme and the failure analyzing apparatus and method of this embodiment. While the conventional standby EMS scheme could not detect emission, the failure analyzing apparatus and method of this invention could detect an emission image from the short-circuited portion between interconnecting lines and could specify the failure location.

A failure originated from the broken gate of an MOSFET was further analyzed. While the conventional standby EMS scheme could not detect emission, the failure analyzing apparatus and method of this embodiment could detect an emission image from the portion where the gate was broken and could easily specify the failure location.

The foregoing description of the first embodiment has been given of the case where the image processing unit 13 requires image data indicating only a failure location by subtracting an emission image which is obtained by the emission analyzer 12 when a defective semiconductor IC chip operates from an emission image which is obtained by the emission analyzer 12 when a good semiconductor IC chip operates. The embodiment may however be modified in such a way that a coloring difference is given to emission images of good and defective samples and both emission images are added by image processing to yield image data which shows a failure location in a darker color, emphasizing that portion.

A failure analyzing apparatus according to a second embodiment of this invention will be discussed below.

The above-described failure analyzing apparatus of the first embodiment should acquire and optimize the conditions for analysis, such as the supply voltage, operational frequency and integration time, in order to reduce emission (false emission) that is detected due to a factor other than a failure caused by the through current or the like. The optimal condition is obtained by checking whether emission is false emission or is originated from a failure with human eyes while changing the conditions, such as the supply voltage, operational frequency and integration time. This work requires about eight hours to optimize the conditions for one pattern per product.

The failure analyzing apparatus according to the second embodiment is designed to automatically obtain and optimize the conditions for analysis, thereby shortening the optimization time. The structure of this failure analyzing apparatus is illustrated in the block diagram of FIG. 7.

The failure analyzing apparatus of this embodiment has a condition providing unit 17 and a data storage unit 18 added to the structure in FIG. 1. The operations of the added condition providing unit 17 and data storage unit 18 are also controlled by the control unit 16.

The condition providing unit 17 controls the operations of the function tester 11, the emission analyzer 12 and the image processing unit 13 based on the output of the emission analyzer 12. The data storage unit 18 has functions of supplying data to the condition providing unit 17 as needed and storing emission image data processed by the image processing unit 13 as reference data.

Figure 7:
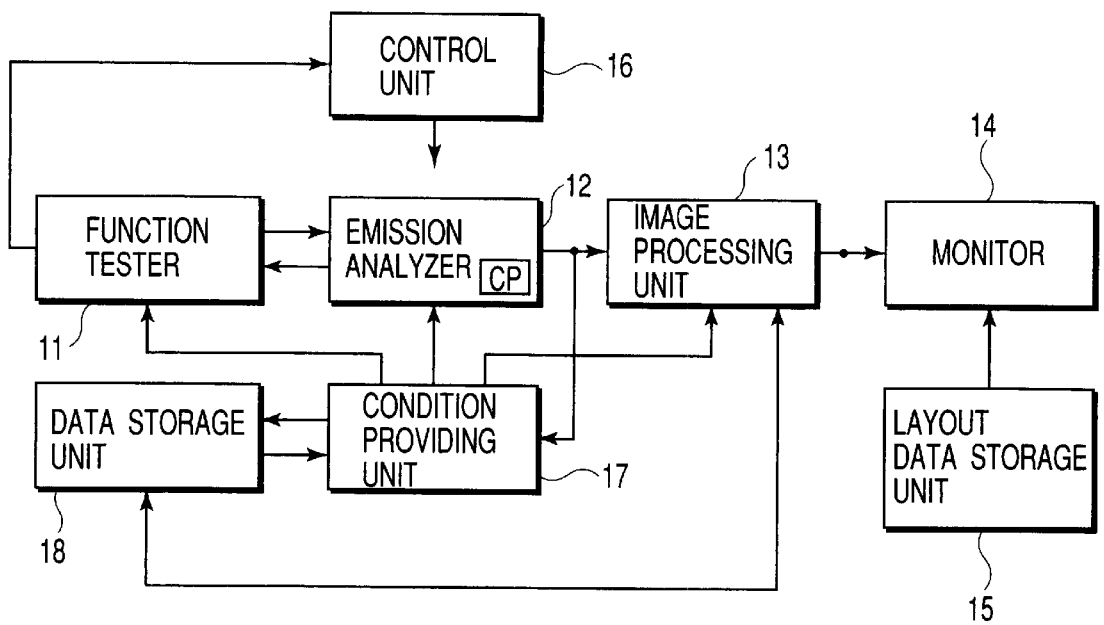
FIG. 7 is a block diagram illustrating the structure of a failure analyzing apparatus according to a second embodiment of this invention.
Figure 8:
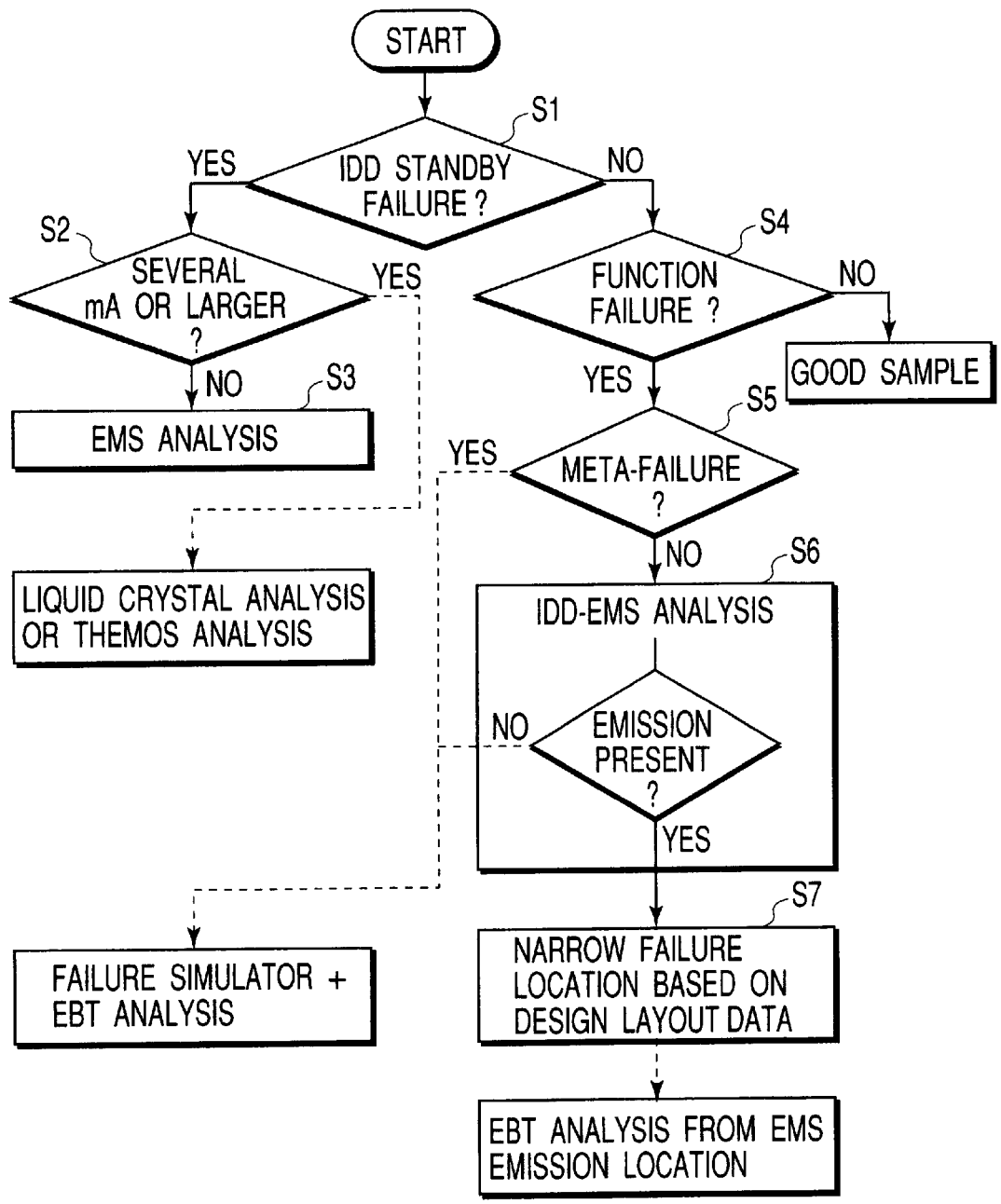
FIG. 8 is a flowchart exemplifying the operation of the failure analyzing apparatus shown in FIG. 7.

FIG. 8 is a flowchart exemplifying the operation of the failure analyzing apparatus shown in FIG. 7. The operation of the apparatus shown in FIG. 7 will be described below referring to this flowchart.

First, it is determined in step S1 if an IDD standby failure has occurred. When it is determined that an IDD standby failure has occurred, it is then determined in next step S2 if the leak current is equal to or larger than several mA based on the test results from the function tester 11. When the leak current is less than several mA, the emission analyzer 12 performs EMS analysis in step S3.

When it is determined that the leak current is equal to or larger than several mA, failure analysis may be conducted by another analyzing method, such as a liquid crystal analysis which uses a change in the state of the liquid crystal (discoloration) at the portion where the temperature becomes partially higher due to the generated leak current or the Themos analysis which uses emission in a high-wavelength area.

When it is not determined in the step S1 that an IDD standby failure has occurred, it is then determined in step S4 whether or not a function failure has occurred based on the test results from the function tester 11. When a function failure has not occurred, the chip is determined as good. When a function failure has occurred, on the other hand, it is determined in next step S5 if all the functions fail, i.e., if a so-called meta-failure has occurred. When it is determined that the meta-failure has occurred, a failure location may be specified by the conventional failure specifying method that uses a simulator and EB tester.

When it is determined in step S5 that no meta-failure has occurred but a failure has occurred in a specific function, the emission analyzer 12 performs the IDD-EMS analysis in next step S6. Specifically, a failure location in a defective sample is specified based on various kinds of image processing using an emission image which is obtained by the emission analyzer 12 when the defective sample operates and an emission image which is obtained by the emission analyzer 12 when the good sample operates, as has been described earlier with reference to FIG. 1.

When emission is not detected by the emission analyzer 12 in the step S6, a failure location may be specified by the conventional failure specifying method that uses a simulator and EB tester, as in the previous case.

After emission is detected by the emission analyzer 12 in step S6, the monitor 14 makes image display showing the layout data of the sample with a predetermined mark, such as a circle, put on the position that corresponds to the failure location, thereby narrowing the failure location. After the display, finer determination of the failure location may be carried out by EBT (Electron Beam Tester) analysis based on an EMS emission location using an EB tester.

The acquisition and optimization of the conditions for failure analysis are automatically executed by a program at the time of carrying out the IDD-EMS analysis in step S6 in the flowchart in FIG. 8. One example of that operation will now be described with reference to the flowchart of FIG. 9.

Figure 10:
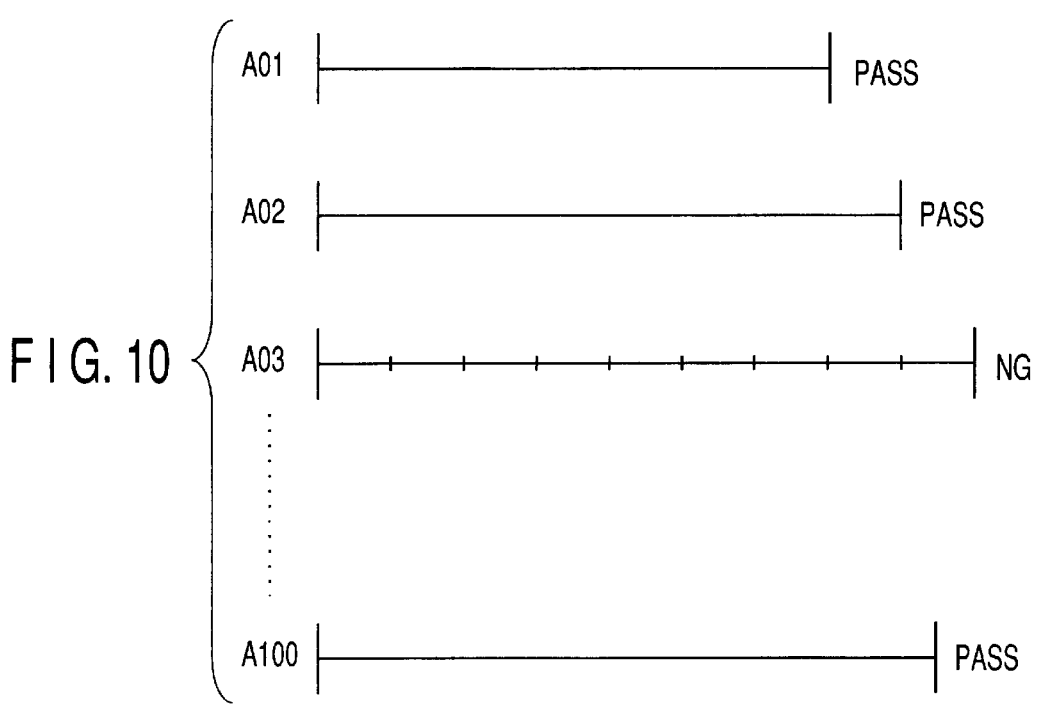
FIG. 10 is a diagram showing one example of a function pattern which is supplied to a sample from a function tester in the failure analyzing apparatus shown in FIG. 7.

As mentioned earlier, the function tester 11 supplies the supply voltages and test signals to a sample (a semiconductor IC chip or a wafer on which multiple chips are integrated) placed in the emission analyzer 12 to set the semiconductor IC chip ready for a function test. First, a failed function pattern (FCN pattern) is extracted in step S11 first. The acquisition of this FCN pattern is performed by the control unit 16. If a function pattern A03 alone is NG (failed) when 100 function patterns A01 to A100 are supplied to the sample from the function tester 11 and the other function patterns all passed (normal) as shown in FIG. 10, the function pattern A03 is extracted as a failed pattern.

Next, false emission is checked and the optimal condition is acquired and stored in a data base in step S12. Specifically, in step S12, the operations of the function tester 11, the emission analyzer 12 and the image processing unit 13 are controlled in accordance with an instruction from the condition providing unit 17 to examine the number of occurrences of false emission in various operational conditions of the sample.

The operational conditions in this case include the value of the supply voltage to be supplied to the sample, the integration time of hot electrons, the operational frequency of the sample, the operational temperature of the sample and the emission frequency characteristic. With those values variously changed as parameters, the number of occurrences of false emission is examined.

For example, the number of occurrences of false emission obtained by the emission analyzer 12 was checked when the supply voltage and the integration time were changed with respect to each of three operational frequencies, 100 KHZ, 1 MHz and 4 MHz. The results are shown on Table 1 below.

TABLE 1

| Supply voltage (V) | Integration time (s) | Number of occurrences of false emission | | |
|---|---|---|---|---|
| | | 100 KHz | 1 MHz | 4 MHZ |
| 2 | 0 | 0 | 0 | 0 |
| . | . | . | . | . |
| 2 | 50 | 0 | 0 | 0 |
| . | . | . | . | . |
| 2 | 350 | 0 | 0 | 0 |
| 2.5 | 0 | 0 | 0 | 0 |
| . | . | . | . | . |

TABLE 1-continued

| Supply voltage (V) | Integration time (s) | Number of occurrences of false emission | | |
|---|---|---|---|---|
| | | 100 KHz | 1 MHz | 4 MHZ |
| . | . | . | . | . |
| . | . | . | . | . |
| . | . | . | . | . |
| 5.5 | 350 | to 100 | to 100 | to 100 |

FIG. 11 shows the examination results given on Table 1 plotted as characteristic curves. The characteristic curves are for an analog-mixed product. In this case, it is considered analyzable when the number of occurrences of false emission is equal to or smaller than 10 including the case of no false emission, and the supply voltage and integration time in the analyzable area are stored as the acquired optimal conditions in the data storage unit 18 as a data base.

Figure 9:
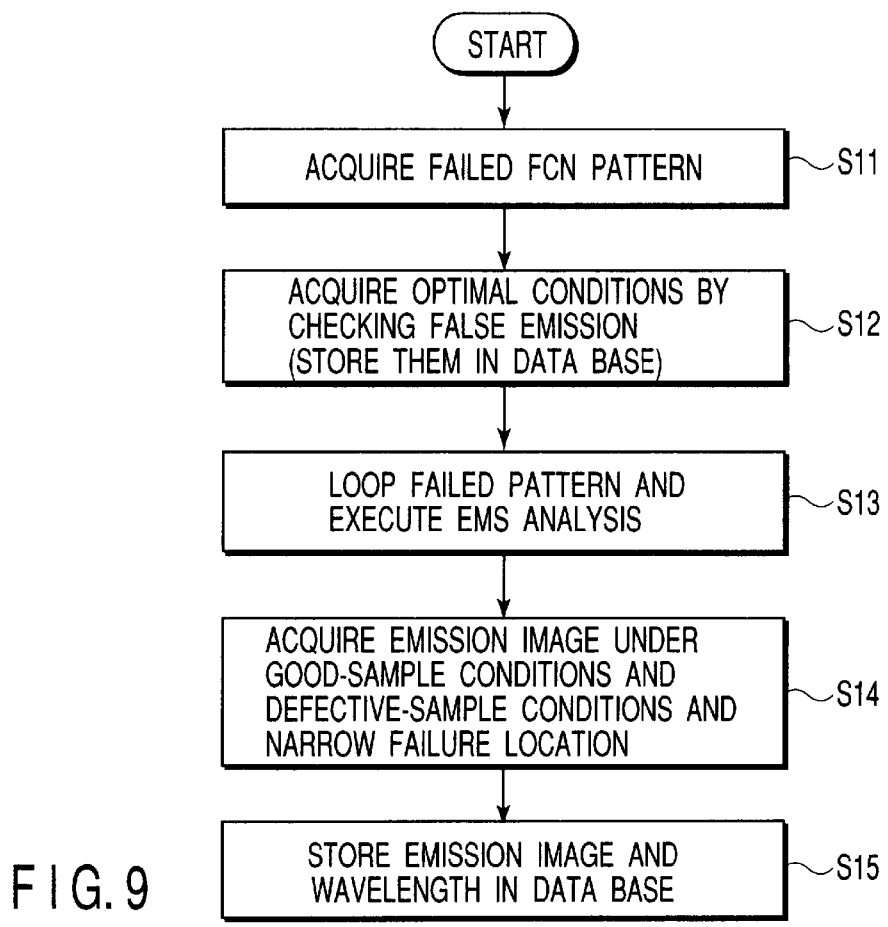
FIG. 9 is a flowchart showing one example of the operation of the failure analyzing apparatus shown in FIG. 7 at the time of acquiring conditions for failure analysis and optimizing the failure analysis.

In step S13 in FIG. 9, EMS analysis is performed by repeatedly supplying the failed pattern to a sample to be subjected to failure analysis. In this case, to operate a sample under the optimal conditions acquired in step S12, the condition providing unit 17 fetches data, such as the supply voltage and integration time, in the analyzable area from the data base in the data storage unit 18 and controls the operations of the function tester 11 and the emission analyzer 12 based on this data. Accordingly, the function tester 11 generates the supply voltage whose value allows one sample to operate in the optimal conditions and the emission analyzer 12 operates to integrate the hot electrons at the optimal integration time.

In next step S14, the emission analyzer 12 acquires emission images under good-sample conditions and defective-sample conditions. The defective-sample conditions are conditions under which a test pattern by which a sample is determined as failing and the good-sample conditions are conditions under which a vector preceding to the vector of a failed pattern is looped back and a test pattern is given. That is, a sample to be subjected to failure analysis itself is used instead of a good sample in this case. Then, the image processing unit 13 performs image processing on the emission images acquired by the emission analyzer 12 under the good-sample conditions and defective-sample conditions, e.g., a process of obtaining the difference between both emission images, and specifies and narrows a failure location in the defective semiconductor IC chip based on the result of the difference process.

In next step S15, the emission image obtained under the good-sample conditions is stored together with its wavelength in the data storage unit 18 so that it can be used again as reference data the next time a sample of the same kind is to be analyzed.

FIGS. 12A to 12C exemplify an emission image obtained by the emission analyzer 12 and an emission image after being subjected to image processing in the image processing unit 13. The image with only a failure location extracted as shown in FIG. 12C is yielded by subtracting the emission image obtained by the emission analyzer 12 under the defective-sample conditions as shown in FIG. 12B from the emission image obtained by the emission analyzer 12 under the good-sample conditions as shown in FIG. 12A.

The second embodiment, like the first embodiment, provides such advantages as to eliminate the need for a vast amount of pre-analysis processing which is required by the conventional method that uses a simulator and EB tester, thus specifying a failure location in a short period of time, and to be able to analyze dynamic type products and analog-mixed products or the like, which could not been analyzed by the EMS scheme. In addition, the automatic acquisition and optimization of the conditions at the time of analyzing a failure in a sample under programmed control can significantly shorten the optimization time.

Although the foregoing description of the second embodiment has been given with reference to the case where the optimizing conditions at the time of executing failure analysis are the supply voltage to be supplied to a sample, the integration time of emission in the emission analyzer and the operational frequency of the sample, a test pattern, a test time, a sample temperature and so forth may be added as the optimizing conditions.

In the second embodiment, the image processing unit 13 acquires image data with only a failure location extracted by subtracting the emission image obtained by the emission analyzer 12 under the defective-sample conditions from the emission image obtained by the emission analyzer 12 under the good-sample conditions. This embodiment may however be modified in such a way that a coloring difference is given to emission images of good and defective samples and both emission images are added by image processing to yield image data which shows a failure location in a darker color, emphasizing that portion. Such alteration of the image processing method in the image processing unit 13 is done by an instruction from the condition providing unit 17 based on the data that is read from the data base in the data storage unit 18.

A failure analyzing apparatus according to a third embodiment of this invention will now be described.

According to the above-described failure analyzing apparatus of the second embodiment, the emission analyzer 12 acquires emission images of good and defective samples using the IDDA-EMS scheme and extracts a different portion from both emission images to specify a failure location. While this method can narrow a failure location to some degree, it cannot specify a real failure location. A failure in a preceding circuit may cause the leak current to flow to the subsequent circuit and the portion where this leak current flows may emit light and may be erroneously specified as a failure location.

Figure 13:
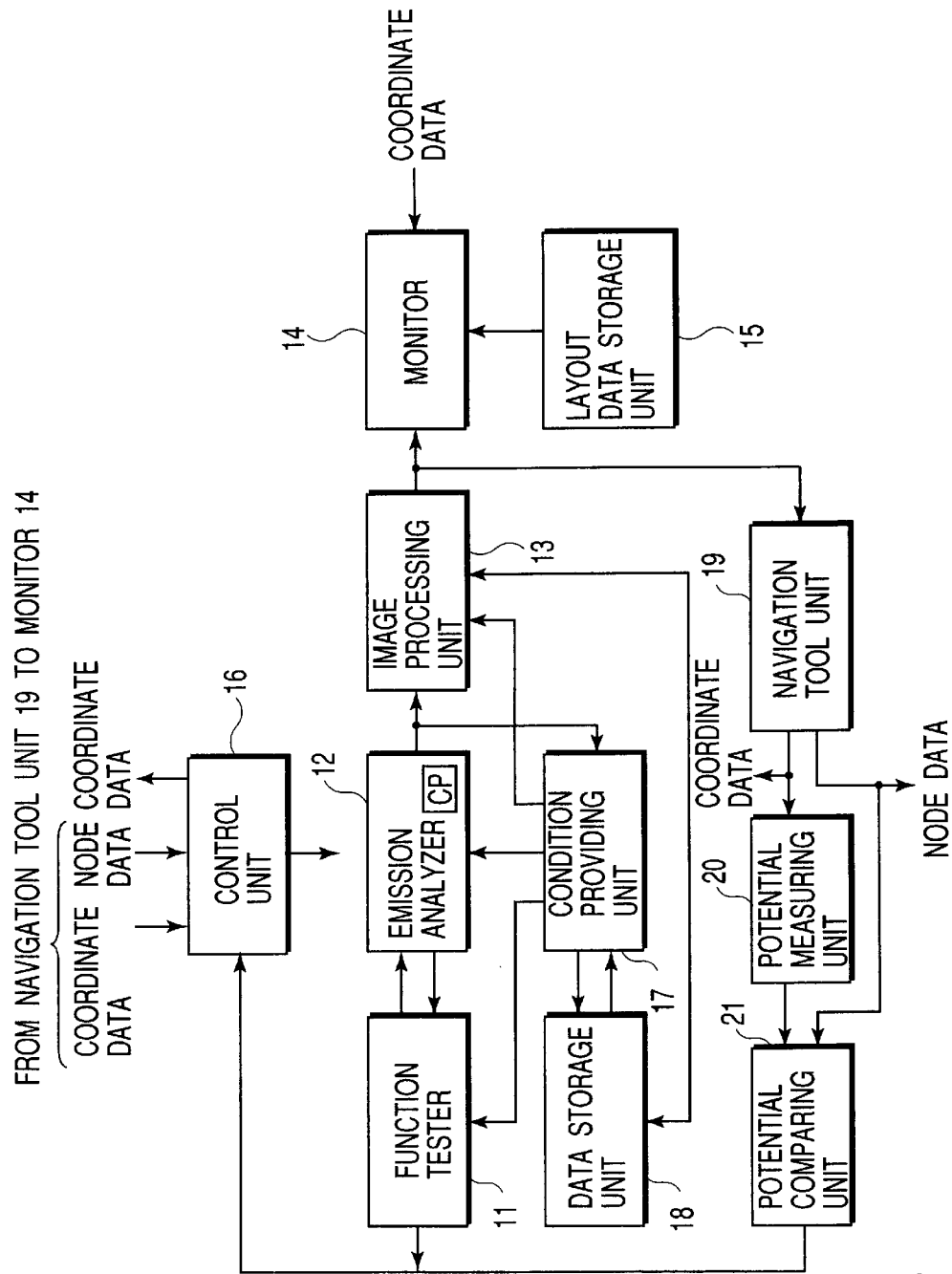
FIG. 13 is a block diagram illustrating the structure of a failure analyzing apparatus according to a third embodiment of this invention.

In view of such a case, the failure analyzing apparatus according to the third embodiment is designed to be able to specify a real failure location. The structure of this failure analyzing apparatus is illustrated in the block diagram of FIG. 13.

The failure analyzing apparatus of this embodiment has a navigation tool unit 19, a potential measuring unit 20 and a potential comparing unit 21 added to the structure in FIG. 7. The operations of those additional units 19 to 21 are also controlled by the control unit 16.

The navigation tool unit 19 stores net data of a sample (e.g., a semiconductor IC chip), i.e., all node data (connection data) and coordinate data in the circuit, receives coordinate data of an emission point from the image processing unit 13 and outputs node data and coordinate data of a node of a preceding circuit which corresponds to the received coordinate data. The coordinate data output from the navigation tool unit 19 is supplied to the potential measuring unit 20. The node data is supplied to the potential comparing unit 21. The coordinate data and node data output from the navigation tool unit 19 are also supplied to the control unit 16.

The potential measuring unit 20, which may be comprised of a static meter or a potentiometer using a laser beam or an ultrasonic wave, measures the absolute potential or the relative potential on the interconnection surface at a position corresponding to the coordinate data generated by the navigation tool unit 19 in a non-contact-to-sample manner. The potential of the sample that is measured by the potential measuring unit 20 is supplied to the potential comparing unit 21.

Expected value data of potentials of all the nodes of a sample to be subjected to failure analysis is previously stored in the potential comparing unit 21. The potential comparing unit 21 compares the potential measured by the potential measuring unit 20 with the expected value of the node that corresponds to node data sent from the navigation tool unit 19. This comparison result is supplied to the control unit 16.

Upon reception of the comparison result from the potential comparing unit 21, the control unit 16 controls the operation of the navigation tool unit 19. As a result, the navigation tool unit 19 sequentially traces back the preceding circuits and outputs coordinate data to the potential measuring unit 20 and sends the corresponding node data to the potential comparing unit 21. The position at which the potential measured by the potential measuring unit 20 differs from the corresponding expected value is the real failure location and coordinate data corresponding to this position is sent from the control unit 16 to the monitor 14 to be displayed thereon. At this time, the monitor 14 may display an image with a predetermined mark placed on the position corresponding to the failure location or may display the measured potential together with the expected value for that position.

According to the third embodiment, as apparent from the above, the navigation tool unit 19 sequentially traces back the preceding circuits, the potential measuring unit 20 measures the potential of a sample and the potential comparing unit 21 compares the potential with a corresponding expected value, so that a real failure location which is not emitting light can be specified.

While the prior art requires EBT analysis done by an expert technician to specify a real failure location, the failure analyzing apparatus of this embodiment does not require such an expert technician. Further, the potential measuring unit 20, which is comprised of a static meter or a potentiometer using a laser beam or an ultrasonic wave, can measure the potential in the air and does not therefore need a so-called vacuuming work to set the environment where a sample is placed to a lower atmospheric pressure as otherwise needed in the case of using an EB tester. This can further shorten the analysis time. For example, the vacuuming work takes about one hour when a sample is a chip and takes about eight hours when a sample is a wafer.

Because the above-described failure analyzing apparatus of the third embodiment specifies a real failure location by measuring the potential and comparing it with an expected value once the failure location is specified with a certain accuracy by using the IDD-EMS scheme, the analysis time can be shortened significantly, about ¹/₁₀ the time needed by analysis using the EB tester. Further, the precision of specifying a failure location becomes approximately 100%, which is a significant improvement from the precision (about 70%) provided by the IDD-EMS scheme.

In the third embodiment, the image processing unit 13 may acquire image data with only a failure location extracted by subtracting the emission image obtained by the emission analyzer 12 under the defective-sample conditions from the emission image obtained by the emission analyzer 12 under the good-sample conditions. This embodiment may however be modified in such a way that a coloring difference is given to emission images of good and defective samples and both emission images are added by image processing to yield image data which shows a failure location in a darker color, emphasizing that portion. Such alteration of the image processing method in the image processing unit 13 is carried out in response to an instruction from the condition providing unit 17 based on the data that is read from the data base in the data storage unit 18.

In short, this invention can provide a failure analyzing apparatus and failure analyzing method for a semiconductor integrated circuit, which can shorten the time needed to specify a failure location and can perform failure analysis on dynamic type products and analog-mixed products as well.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A failure analyzing apparatus for a semiconductor integrated circuit, comprising:

a test signal generating section for generating test signals for operating a semiconductor integrated circuit chip;

an emission image detecting section for detecting an emission image formed by hot electrons emitted from a good semiconductor integrated circuit chip and an emission image formed by hot electrons emitted from a target semiconductor integrated circuit chip to be subjected to failure analysis, both chips being operable upon reception of said test signals; and an image processing section, connected to said emission image detecting section, for specifying a failure location in said target semiconductor integrated circuit chip based on both emission images detected by said emission image detecting section.

2. The failure analyzing apparatus according to claim 1, wherein said image processing section specifies a failure location by performing image processing on said emission image formed by said hot electrons emitted from said good semiconductor integrated circuit chip and said emission image formed by said hot electrons emitted from said target semiconductor integrated circuit chip.

3. The failure analyzing apparatus according to claim 2, wherein said image processing section specifies a failure location by acquiring a difference between said emission image formed by said hot electrons emitted from said good semiconductor integrated circuit chip and said emission image formed by said hot electrons emitted from said target semiconductor integrated circuit chip through said image processing.

4. The failure analyzing apparatus according to claim 1, wherein said image processing section specifies a failure location by providing a coloring difference with respect to said emission image formed by said hot electrons emitted from said good semiconductor integrated circuit chip and said emission image formed by said hot electrons emitted from said target semiconductor integrated circuit chip and adding both emission images through image processing.

5. A failure analyzing method for a semiconductor integrated circuit, comprising:

operating a good semiconductor integrated circuit chip and a target semiconductor integrated circuit chip to be subjected to failure analysis by supplying test signals to said good semiconductor integrated circuit chip and said target semiconductor integrated circuit chip from a testing device;

detecting an emission image formed by hot electrons emitted from said good semiconductor integrated circuit chip and an emission image formed by hot electrons emitted from said target semiconductor integrated circuit chip using an emission analyzer; and specifying a failure location in said target semiconductor integrated circuit chip by performing image processing on both emission images detected.

6. The failure analyzing method according to claim 5, wherein a failure location is specified by acquiring a difference between said emission image formed by said hot electrons emitted from said good semiconductor integrated circuit chip and said emission image formed by said hot electrons emitted from said target semiconductor integrated circuit chip.

7. The failure analyzing method according to claim 5, wherein a failure location is specified by providing a coloring difference with respect to said emission image formed by said hot electrons emitted from said good semiconductor integrated circuit chip and said emission image formed by said hot electrons emitted from said target semiconductor integrated circuit chip and adding both emission images.

8. A failure analyzing apparatus for a semiconductor integrated circuit, comprising:

a function tester for generating test signals and supplying said test signals to a semiconductor integrated circuit chip to execute a function test thereof;

an emission analyzer for detecting an emission image formed by hot electrons emitted from said semiconductor integrated circuit chip when said function test is performed by said function tester;

an image processing device, connected to said emission analyzer, for specifying a failure location in a target semiconductor integrated circuit chip to be subjected to failure analysis, based on an emission image of a good semiconductor integrated circuit chip detected by said emission analyzer and an emission image of said target semiconductor integrated circuit chip; and a display device, connected to said image processing device, for displaying said failure location specified by said image processing device.

9. The failure analyzing apparatus according to claim 8, wherein said image processing device specifies a failure location by acquiring a difference between said emission image formed by said hot electrons emitted from said good semiconductor integrated circuit chip and said emission image formed by said hot electrons emitted from said target semiconductor integrated circuit chip.

10. The failure analyzing apparatus according to claim 8, wherein said image processing device specifies a failure location by providing a coloring difference with respect to said emission image formed by said hot electrons emitted from said good semiconductor integrated circuit chip and said emission image formed by said hot electrons emitted from said target semiconductor integrated circuit chip and adding both emission images.

11. A failure analyzing apparatus for a semiconductor integrated circuit, comprising:

a function tester for generating supply voltages and test signals and supplying said supply voltages and said test signals to a semiconductor integrated circuit chip to execute a function test thereof;

an emission analyzer for detecting an emission image by integrating hot electrons emitted from said semiconductor integrated circuit chip when said function test is performed by said function tester, an integration time for said hot electrons being variable;

an image processing device, connected to said emission analyzer, for specifying a failure location in a target semiconductor integrated circuit chip to be subjected to failure analysis, based on an emission image of a good semiconductor integrated circuit chip detected by said emission analyzer and an emission image of said target semiconductor integrated circuit chip;

a display device, connected to said image processing device, for displaying said failure location specified by said image processing device; and a condition providing device for altering an operational condition by variously changing at least a value of said supply voltages generated by said function tester and/or said integration time for hot electrons in said emission analyzer, causing said function tester to operate said target semiconductor integrated circuit chip in each alteration to check a number of occurrences of false emission caused by emission images detected by said emission analyzer, and acquiring that operational condition under which said number of occurrences of false emission becomes equal to or smaller than a predetermined value, whereby an operation of said function tester and/or an operation of said emission analyzer is controlled based on said operational condition acquired by said condition providing device.

12. The failure analyzing apparatus according to claim 11, wherein said image processing device specifies a failure location by performing image processing on said emission image formed by said hot electrons emitted from said good semiconductor integrated circuit chip and said emission image formed by said hot electrons emitted from said target semiconductor integrated circuit chip.

13. The failure analyzing apparatus according to claim 12, wherein said image processing device specifies a failure location by acquiring a difference between said emission image formed by said hot electrons emitted from said good semiconductor integrated circuit chip and said emission image formed by said hot electrons emitted from said target semiconductor integrated circuit chip.

14. The failure analyzing apparatus according to claim 12, wherein said image processing device specifies a failure location by providing a coloring difference with respect to said emission image formed by said hot electrons emitted from said good semiconductor integrated circuit chip and said emission image formed by said hot electrons emitted from said target semiconductor integrated circuit chip and adding both emission images.

15. A failure analyzing apparatus for a semiconductor integrated circuit, comprising:

a function tester for generating supply voltages and test signals and supplying said supply voltages and said test signals to a semiconductor integrated circuit chip to execute a function test thereof;

an emission analyzer for detecting an emission image by integrating hot electrons emitted from said semiconductor integrated circuit chip when said function test is performed by said function tester, an integration time for said hot electrons being variable;

an image processing device, connected to said emission analyzer, for specifying a failure location in a target semiconductor integrated circuit chip to be subjected to failure analysis, based on an emission image of a good semiconductor integrated circuit chip detected by said emission analyzer and an emission image of said target semiconductor integrated circuit chip, and outputting coordinate data of said failure location;

a display device, connected to said image processing device, for displaying said failure location specified by said image processing device;

a condition providing device for altering an operational condition by variously changing at least a value of said supply voltages generated by said function tester and/or said integration time for hot electrons in said emission analyzer, causing said function tester to operate said target semiconductor integrated circuit chip in each alteration to check a number of occurrences of false emission caused by emission images detected by said emission analyzer, and acquiring that operational condition under which said number of occurrences of false emission becomes equal to or smaller than a predetermined value, whereby an operation of said function tester and/or an operation of said emission analyzer is controlled based on said operational condition acquired by said condition providing device;

a navigation device, connected to said image processing device, for storing net data and coordinate data of said target semiconductor integrated circuit chip and generating node data and coordinate data which are associated with a node of a preceding circuit of a node corresponding to said coordinate data output from said image processing device;

a potential measuring device, connected to said navigation device, for measuring a potential of a surface of said semiconductor integrated circuit at a position corresponding to said coordinate data generated by said navigation device;

a potential comparing device, connected to said potential measuring device and said navigation device, for storing expected value data of potentials at all nodes of said target semiconductor integrated circuit chip and comparing said potential measured by said potential measuring device with an expected value of a node corresponding to said node data provided by said navigation device; and a coordinate data outputting device, connected to said potential comparing device, for outputting coordinate data of said node corresponding to said node data provided by said navigation device to said display device as coordinate data corresponding to a failure location in said target semiconductor integrated circuit chip when said potential measured by said potential measuring device does not match with said expected value of said node corresponding to said node data provided by said navigation device.

16. The failure analyzing apparatus according to claim 15, wherein said image processing device specifies a failure location by performing image processing on said emission image formed by said hot electrons emitted from said good semiconductor integrated circuit chip and said emission image formed by said hot electrons emitted from said target semiconductor integrated circuit chip.

17. The failure analyzing apparatus according to claim 16, wherein said image processing device specifies a failure location by acquiring a difference between said emission image formed by said hot electrons emitted from said good semiconductor integrated circuit chip and said emission image formed by said hot electrons emitted from said target semiconductor integrated circuit chip through said image processing.

18. The failure analyzing apparatus according to claim 15, wherein said image processing device specifies a failure location by providing a coloring difference with respect to said emission image formed by said hot electrons emitted from said good semiconductor integrated circuit chip and said emission image formed by said hot electrons emitted from said target semiconductor integrated circuit chip and adding both emission images through image processing.

* * * * *